United States Patent [19]
Bruce et al.

[11] Patent Number: 6,054,184
[45] Date of Patent: Apr. 25, 2000

[54] METHOD FOR FORMING A MULTILAYER THERMAL BARRIER COATING

[75] Inventors: Robert W. Bruce, Loveland, Ohio; Mark A. Rosenzweig, Waldorf, Md.; Jon C. Schaeffer, Milford, Ohio; David J. Wortman, Hamilton, Ohio; Norman R. Lindblad, Cincinnati, Ohio

[73] Assignee: General Electric Company, Cincinnati, Ohio

[21] Appl. No.: 08/902,490

[22] Filed: Jul. 29, 1997

Related U.S. Application Data

[63] Continuation of application No. 08/655,050, Jun. 4, 1996, abandoned.

[51] Int. Cl.[7] .......................... C23C 16/00; C23C 14/30
[52] U.S. Cl. .................................. 427/255.7; 427/248.1; 427/419.3; 427/596
[58] Field of Search ...................... 427/551, 595, 427/596, 597, 255.7, 248.1, 419.3

[56] References Cited

U.S. PATENT DOCUMENTS

| | | | |
|---|---|---|---|
| 4,401,697 | 8/1983 | Strangman | 427/255.7 |
| 4,774,150 | 9/1988 | Amano et al. | 427/157 |
| 4,880,614 | 11/1989 | Strangman et al. | 427/248.1 |
| 5,087,477 | 2/1992 | Giggins et al. | 427/255.7 |
| 5,305,726 | 4/1994 | Scharman et al. | 427/204 |
| 5,350,599 | 9/1994 | Rigney et al. | 427/255.7 |
| 5,407,705 | 4/1995 | Vakil | 427/255.7 |
| 5,418,003 | 5/1995 | Bruce et al. | 427/126.3 |

OTHER PUBLICATIONS

Movchan, B.A., "EB–PVD Technology in the Gas Turbine Industry: Present and Future", Journal of Metals, Nov. 1996, pp. 40–45.

*Primary Examiner*—Shrive Beck
*Assistant Examiner*—Bret Chen
*Attorney, Agent, or Firm*—Andrew C. Hess; David L. Narciso

[57] ABSTRACT

A method and apparatus for forming a multilayer thermal barrier coating such that the coating is composed of substantially homogeneous layers of different ceramic materials. The method entails supporting an article within a coating apparatus and in proximity to ceramic ingots of the different ceramic materials, and then simultaneously directing electron beams at both ingots so as to maintain a portion of each ingot in a molten state. According to a particular aspect of this invention, vapors of both ceramic materials coexist within the coating apparatus, yet each ceramic material is sequentially deposited onto the article by sequentially interrupting exposure of surfaces of the article to the vapors, such that the vapors form homogeneous successive layers on the surface. Exposure of the article to one or more of the vapors can be interrupted with a baffle, such that the vapor of only one of the ceramic ingots is directly deposited on a given surface of the article at any instant. The baffle can be employed in conjunction with the article being rotated at a constant or variable speed, and/or being translated above the members within the vessel to alter the relative thicknesses of the ceramic and an intermediate layer that is formed between adjacent layers and is composed of a mixture of the ceramic materials.

20 Claims, 5 Drawing Sheets

METHOD FOR FORMING A MULTILAYER THERMAL BARRIER COATING

This application is a Continuation of application Ser. No. 08/655,050 filed Jun. 4, 1996.

The invention herein described was made in the performance of work under a NASA contract and is subject to the provisions of Section 305 of the National Aeronautics and Space Act of 1958, Public Law 85-568 (72 Stat. 435, 42 USC 2457).

This invention relates to thermal barrier coatings for components exposed to high temperatures, such as the hostile thermal environment of a gas turbine engine. More particularly, this invention is directed to a method for forming a multilayer thermal barrier coating composed of different ceramic coating materials that are separately and sequentially deposited to form homogeneous ceramic layers.

BACKGROUND OF THE INVENTION

Higher operating temperatures of gas turbine engines are continuously sought in order to increase their efficiency. However, as operating temperatures increase, the high temperature durability of the components of the engine must correspondingly increase. Significant advances in high temperature capabilities have been achieved through the formulation of nickel and cobalt-base superalloys, though such alloys alone are often inadequate to form components located in certain sections of a gas turbine engine, such as the turbine, combustor and augmentor. A common solution is to thermally insulate such components in order to minimize their service temperatures. For this purpose, thermal barrier coatings (TBCS) formed on the exposed surfaces of high temperature components have found wide use.

To be effective, thermal barrier coatings must have low thermal conductivity, capable of being strongly adhered to the article, and remain adherent through many heating and cooling cycles. The latter requirement is particular demanding due to the different coefficients of thermal expansion between materials having low thermal conductivity and superalloy materials used to form turbine engine components. For this reason, thermal barrier coatings have generally employed a metallic bond layer deposited on the surface of a superalloy component, followed by an adherent ceramic layer that serves to thermally insulate the component, which together form what is termed a thermal barrier coating system. The metallic bond layer is formed from an oxidation-resistant alloy, such as MCrAlY where M is iron, cobalt and/or nickel, and promotes the adhesion of the ceramic layer to the component while also preventing oxidation of the underlying superalloy.

Various ceramic materials have been employed as the ceramic layer, particularly zirconia ($ZrO_2$) stabilized by yttria ($Y_2O_3$), magnesia (MgO) or another oxide. These particular materials are widely employed in the art because they can be readily deposited by plasma spray, flame spray and vapor deposition techniques, and are reflective to infrared radiation so as to minimize the absorption of radiated heat by the coated component. A continuing challenge of thermal barrier coating systems has been the formation of a more adherent ceramic layer that is less susceptible to spalling when subjected to thermal cycling. For this purpose, the prior art has proposed various coating systems, with considerable emphasis on ceramic layers having enhanced strain tolerance as a result of the presence of porosity, microcracks and segmentation of the ceramic layer. Microcracks generally denote random internal discontinuities within the ceramic layer, while segmentation indicates that the ceramic layer has columnar grain boundaries oriented perpendicularly to the surface of the component. As is known in the art, a thermal barrier coating having a columnar grain structure is able to expand with its underlying substrate without causing damaging stresses that lead to spallation, as evidenced by thermal cyclic testing.

Zirconia-base thermal barrier coatings, and particularly yttria-stabilized zirconia (YSZ) coatings having columnar grain structures and a thickness on the order of about 125 micrometers (about 0.005 inch) or more are widely employed in the art for their desirable thermal and adhesion characteristics. However, YSZ coatings are susceptible to erosion from particles and debris present in the high velocity gas stream of a gas turbine engine. Though a solution to a high erosion rate is to increase the thickness of a thermal barrier coating, drawbacks include additional weight incurred and an increase in thermal stresses within the coating, leading to a higher incidence of spallation. Consequently, there is a need for erosion-resistant thermal barrier coating systems having minimal thicknesses.

Attempts to produce erosion-resistant thermal barrier coating systems for high temperature applications in a gas turbine engine have been directed to thermally treating the outer surface of the ceramic material or providing an additional wear-resistant outer coating to promote the erosion resistance of the coating system. More wear-resistant outer coating materials suggested in the past have included zircon ($ZrSiO_4$), silica ($SiO_2$), chromia ($Cr_2O_3$) and alumina ($Al_2O_3$). In the prior art, multiple coating layers have been deposited by inserting the component in a vacuum coating chamber where the base coating layer is deposited by vaporizing an ingot of the desired material, such as YSZ, and then inserting the component in a second vacuum coating chamber where an ingot of the second desired material is vaporized to deposit a second coating layer. Expectedly, such a process for applying multiple coating layers is time consuming and expensive, particularly for coating mass-produced components such as airfoils for a gas turbine engine. In addition, contamination of the coating system can occur due to exposure of the coating between applications.

Various improved methods and apparatuses have been suggested that are capable of depositing layers of different materials within a single coating chamber, as evidenced by U.S. Pat. No. 3,205,087 to Allen and U.S. Pat. No. 4,632,059 to Flatscher et al. However, process control and stable application temperatures have been difficult to achieve and maintain due to the necessity to intermittently reheat the ingot materials being vaporized and deposited, since continuously maintaining the ingots at an elevated temperature would lead to intermixing of the coating materials. As a result, such methods are rather time-consuming, and optimal adhesion of the coating layers is difficult to achieve.

Accordingly, what is needed is a method for forming a multilayer thermal barrier coating system characterized by enhanced resistance to spallation when subjected to erosion in a hostile thermal environment, in which the method is particularly well suited for use in mass production.

SUMMARY OF THE INVENTION

It is an object of this invention to provide a method for forming a thermal barrier coating composed of multiple layers of different thermal insulating materials.

It is another object of this invention that the method is capable of rapidly and sequentially depositing discrete homogeneous layers of the materials within a single coating apparatus.

It is yet another object of this invention that the method is capable of depositing the multiple layers in a manner that promotes process and temperature control, and enables accurate control of the thickness and number of the individual layers.

The present invention makes possible a thermal barrier coating which is adapted to be formed on an article subjected to a hostile thermal environment while subjected to erosion by particles and debris, as is the case with turbine, combustor and augmentor components of a gas turbine engine. The thermal barrier coating is composed of multiple layers of different ceramic materials, one or more of which preferably serves to render the article more resistant to a hostile thermal environment, e.g., low thermal conductivity and/or a barrier to oxygen diffusion, while one or more other materials are deposited to enhance the articles resistance to erosion. Suitable erosion-resistant ceramic materials include alumina ($Al_2O_3$), while a preferred thermal-insulating ceramic material is yttria-stabilized zirconia (YSZ) having a columnar grain structure.

According to the present invention, the multiple layers are sequentially deposited by physical vapor deposition (PVD) in such a manner that the individual layers are substantially homogeneous, and may include a transitional interface layer between adjacent layers that is a mixture of the adjacent layer materials. Furthermore, the method by which the multiple layers are deposited is capable of rapidly depositing the layers in a manner that maximizes the number of individual layers while minimizing the thickness of the thermal barrier coating. The method of this invention generally entails supporting an article in proximity to members of the different ceramic coating materials within a vessel that is at least partially evacuated. Electron beams are simultaneously directed at each of the members so as to melt a surface of each member and produce a vapor of each of the different ceramic coating materials that deposits onto the article. According to a particular aspect of this invention, the members are continuously subjected to their respective electron beams such that the surface of each member remains molten throughout the deposition process, thereby eliminating the prior art requirement to remelt the members before the initiation of each deposition cycle. Because the vapors of the different ceramic coating materials coexist within the vessel, the method of this invention further entails sequentially interrupting exposure of a surface of the article to the vapors such that the vapors sequentially deposit onto the surface and form homogeneous successive layers on the surface.

A preferred technique for interrupting exposure of the article to one or more of the vapors is to separate the members with a baffle, such that the vapor of only one of the ceramic members is deposited on the surface at any given instant. The baffle can be employed in conjunction with the article being rotated at a constant or variable speed, and/or being translated above the members within the vessel. Physical interruption of the vapors generally yields an intermediate layer formed between adjacent layers, the intermediate layer being a mixture of the ceramic coating materials that form the adjacent layers. Interruption can be carried out such that the successive layers and the intermediate layers have different thickness.

In the above manner, each of the different ceramic coating materials is deposited to form a homogeneous layer on the article, yet within a single vessel in which vapors of each coating material coexist. As such, coating rates attained by the method of this invention can approach that for depositing a single ceramic material. Furthermore, the adhesion characteristics of the coating system are not degraded by fluctuating process temperatures and the prior art requirement to repeatedly revaporize the coating materials. In addition, the thicknesses of the individual layers can be accurately controlled through use of the baffle and orientation of the article, enabling the thermal and mechanical properties of the resulting coating system to be tailored for a given application.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings, in which.

DETAILED DESCRIPTION OF THE INVENTION

The present invention is generally directed to a method for depositing a thermal barrier coating on a metal component intended for operation within an environment characterized by high temperatures, in which the component is subjected to a combination of thermal stresses and erosion by particles and debris. Notable examples of such components include the high and low pressure turbine nozzles and blades, shrouds, combustor liners and augmentor hardware of gas turbine engines, and components of reciprocating internal combustion engines. While the advantages of this invention will be illustrated and described with reference to a turbine blade of a gas turbine engine, the teachings of this invention are generally applicable to any component in which a thermal barrier coating can be used to insulate the component from a hostile thermal environment.

Figure 1:
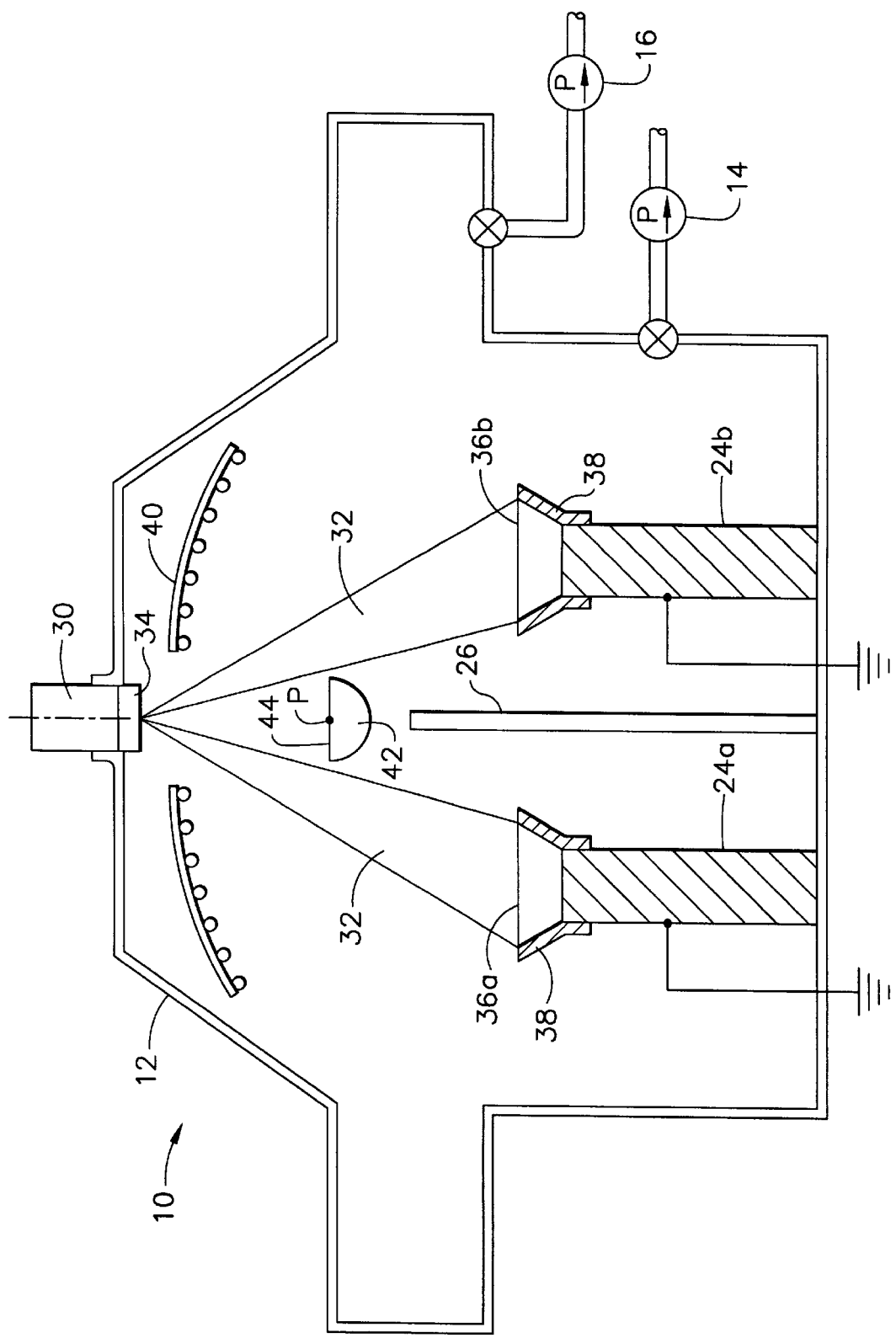
FIG. 1 shows a schematic representation of a physical vapor deposition apparatus used to deposit a multilayer thermal barrier coating system in accordance with this invention.
Figure 5:
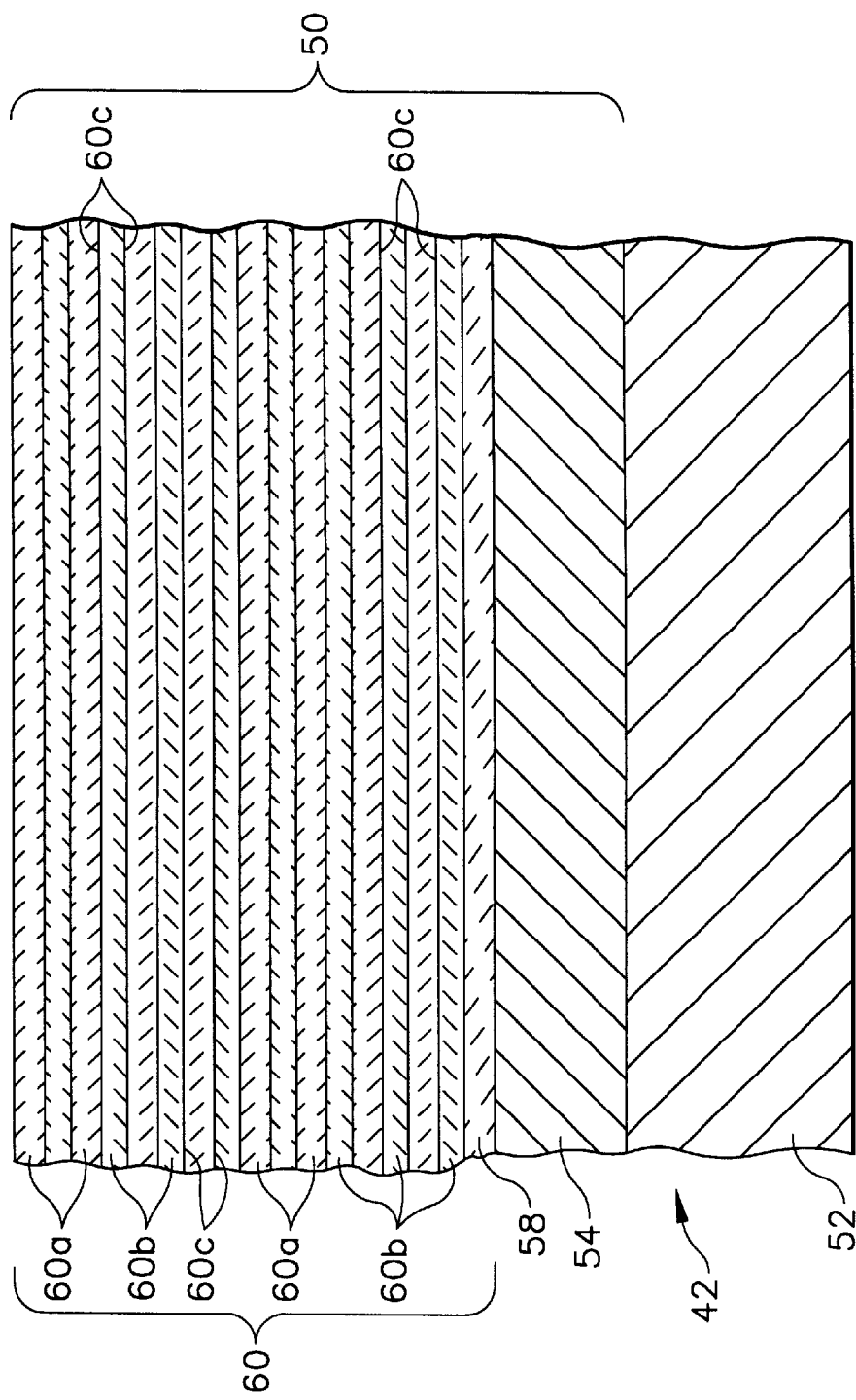
FIG. 5 is a schematic sectional view of a multilayer thermal barrier coating system deposited on an airfoil in accordance with the apparatus of FIG. 1 and the method of this invention.

To illustrate the invention, an electron beam physical vapor deposition (EB-PVD) apparatus 10 is shown in FIG. 1. Shown supported within the apparatus 10 is a turbine blade 42 of a gas turbine engine. As is generally conventional, the blade 42 may be formed of a nickel-base or cobalt-base superalloy. The blade 42 includes an airfoil section against which hot combustion gases are directed during operation of the gas turbine engine, and whose surface is therefore subjected to severe attack by oxidation, corrosion and erosion. Schematically represented in FIG. 5 is an erosion-resistant thermal barrier coating system 50 that is adherently formed on the surface of the blade 42 to protect its superalloy substrate 52 from the hostile environment of the turbine section. The coating system 50 is composed of a bond layer 54 over which a multilayer ceramic coating 60 is formed. As is also conventional, the bond layer 54 is preferably formed of a metallic oxidation-resistant material, such that the bond layer 54 protects the underlying substrate 52 from oxidation and enables the multilayer ceramic coating 60 to more tenaciously adhere to the substrate 52. A suitable bond layer 54 can be formed from an oxidation-resistant MCrAlY alloy such as NiCrAlY, or an intermetallic platinum or nickel aluminide, or an aluminide layer overlying an MCrAlY layer, the total thickness of which is about 25 to about 250 micrometers. Following deposition of the bond layer 54, an oxide layer 58 such as alumina may be formed at an elevated processing temperature to promote adhesion of the ceramic coating 60.

According to this invention, the ceramic coating 60 is composed of numerous discrete and homogeneous ceramic layers of different ceramic materials characterized by differing thermal conductivities and resistances to erosion, such as alternating layers 60*a* and 60*b* of alumina and about 6 to 8 weight percent yttria-stabilized zirconia (YSZ), respectively, as is represented in FIG. 5. The presence of a ceramic material having a low thermal conductivity, such as YSZ, serves to render the blade 42 more resistant to a hostile thermal environment, while the presence of a ceramic material having a greater resistance to erosion, such as alumina, promotes the service life of the coating system 50. The apparatus 10 shown in FIG. 1 is adapted to sequentially deposit the desired ceramic layers 60*a* and 60*b* by physical vapor deposition in such a manner that the individual ceramic layers 60*a* and 60*b* are substantially homogeneous. Furthermore, the apparatus 10 is adapted to rapidly deposit the ceramic layers 60*a* and 60*b* in a manner that controls the number of individual layers 60*a* and 60*b* while controlling the thicknesses of the individual layers 60*a* and 60*b* as well as thickness of the ceramic coating 60. As a result, adhesion of the ceramic coating 60 to the substrate 52 is also promoted by this invention.

To achieve the above, the apparatus 10 is configured to house two or more ingots 24*a* and 24*b* of the different ceramic materials intended to be deposited, and an electron beam gun 30 equipped with deflection plates 34 to appropriately deflect a beam 32 of electrons toward each of the ingots 24*a* and 24*b*. The deflection plates 34 can be of any type suitable for deflecting the electron beams 32, including known electrostatic and electromagnet devices. As is conventional, the apparatus 10 includes a vacuum chamber 12 capable of being maintained at a vacuum level of about $1 \times 10^{-3}$ Torr or less. A mechanical pump 14 and a diffusion pump 16 of types known in the art are employed to evacuate the chamber 12 during the deposition process.

The blade 42 is preferably secured to a rotatable and/or translatable support whose axis is identified as point P in FIGS. 1 through 4. The ingots 24*a* and 24*b* are located within the chamber 12 such that the top of each ingot 24*a* and 24*b* is adjacent the blade 42, as shown in FIG. 1. A vacuum of about $1 \times 10^{-3}$ Torr is then drawn within the chamber 12. With the electron beam gun 30 positioned adjacent the tops of the ingots 24*a* and 24*b*, the electron beams 32 emitted by the gun 30 are directed with the deflection plates 34 toward the upper surfaces 36*a* and 36*b* of the ingots 24*a* and 24*b*, respectively. In so doing, the upper surfaces 36*a* and 36*b* are simultaneously melted by the energy of the electrons to form molten pools of the ceramic materials of the ingots 24*a* and 24*b*. As shown, crucibles 38 can be used to contain the molten pools of ceramic.

Intense heating of the ceramic materials by the electron beams 32 causes molecules of the ceramic materials to evaporate, travel upwardly, and then deposit on the surface of the blade 42. A heater 40 may be positioned above the blade 42 to provide additional heating as may be required to supplement the heat provided by the vaporized ceramic materials and the radiation from the top surfaces 36*a* and 36*b* of the ingots 24*a* and 24*b*. Together, the heater 40 and heat generated during evaporation of the ceramic materials serve to bring the blade 42 to a suitable deposition temperature of about 700° C. to about 1100° C. Importantly, appropriate maintenance of a stable blade temperature promotes the adhesion of each ceramic layer 60*a* and 60*b* to the underlying surface. In addition, a stable temperature of the blade 42 also promotes a columnar grain structure for the ceramic layers 60*a* and 60*b*, in which the longitudinal axis of each grain is roughly perpendicular to the surface of the blade 42, though such a grain structure is not a requirement of the present invention. Depending on the materials for the ceramic layers 60*a* and 60*b* and the processing parameters employed, the process of this invention may be carried out such that either, both, or neither of the ceramic layers 60*a* and 60*b* will have a columnar grain structure.

Figure 2:
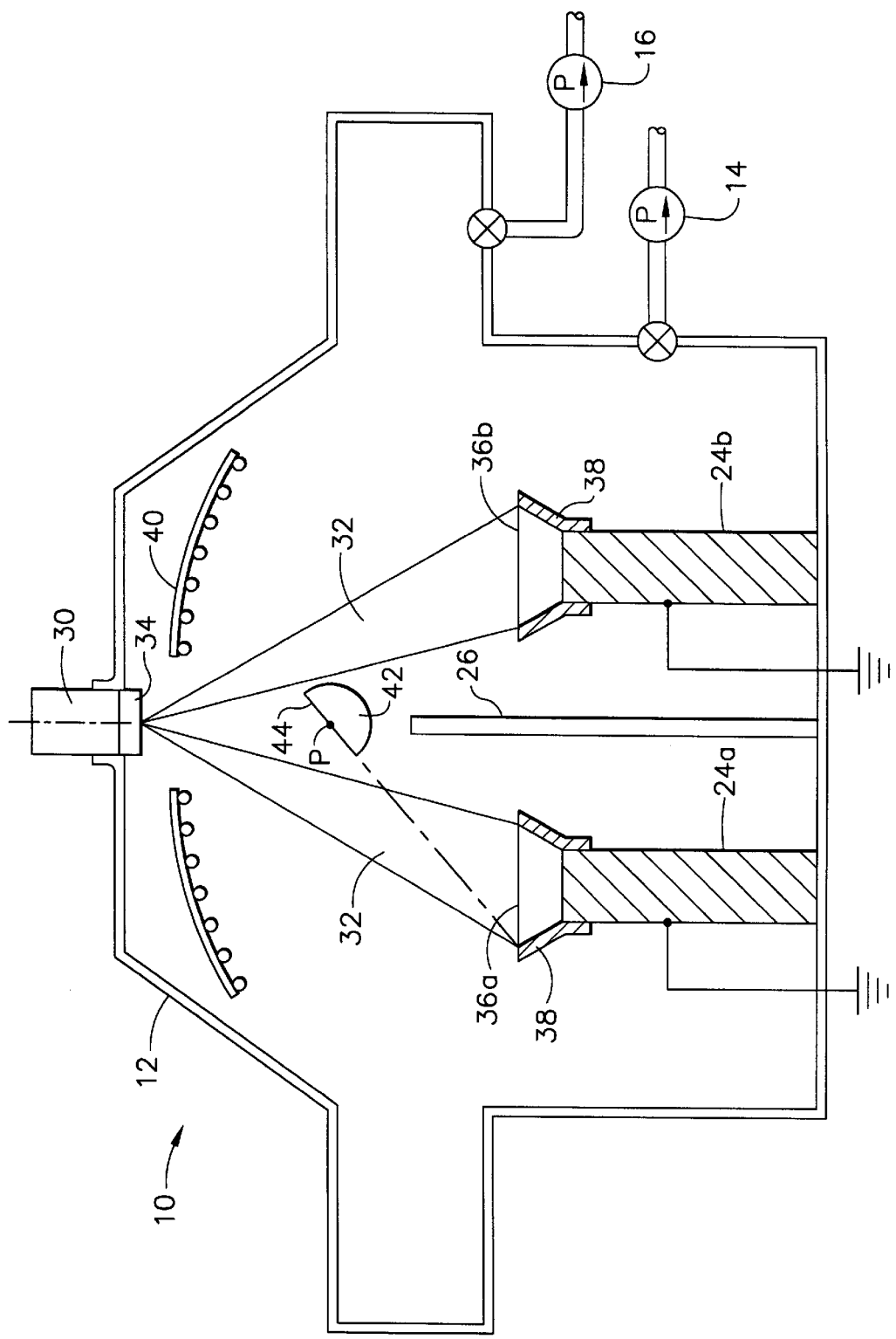
FIGS. 2, 3 and 4 schematically illustrate deposition stages of the apparatus of FIG. 1.
Figure 3:
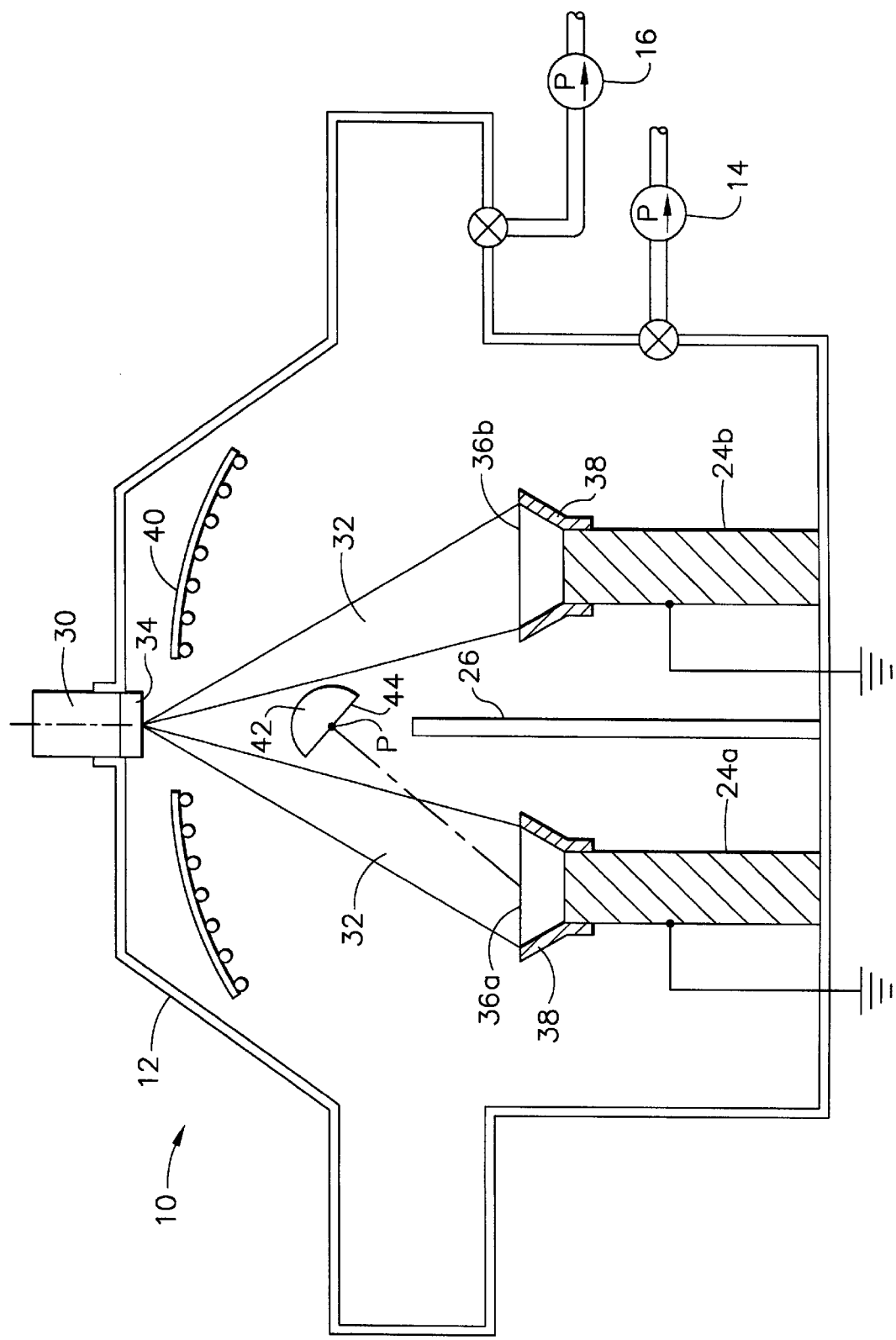

According to the above, the evaporation process of this invention maintains a molten pool of ceramic for each ingot 24*a* and 24*b*, such that ceramic vapors of each ceramic material coexist within the chamber 12. In so doing, the requirement to remelt the ingots 24*a* and 24*b* is avoided, yielding a highly controllable deposition process and a stable temperature for the blade 42. Deposition of the different ceramic materials is controlled at least in part by the rotation and/or translation of the blade 42 relative to the ingots 24*a* and 24*b*. As shown in FIGS. 1 through 4, the blade 42 can be rotated around point P, such that a relatively planar surface 44 of the blade 42 is periodically exposed to each of the molten pools of ceramic materials contained in the crucibles 38. As shown in FIG. 2, deposition of the ceramic material from the ingot 24*a* onto the surface 44 is initiated as the blade 42 is rotated counterclockwise, while deposition onto the surface 44 of the ceramic material from the ingot 24*b* is substantially prevented by the orientation of the blade 42 relative to the ingot 24*b*. FIG. 3 illustrates the surface 44 as receiving a "line-of-sight" coating from the ingot 24*a*, while deposition of the ceramic material from the ingot 24*b* will be initiated as the blade 42 continues to rotate counterclockwise. As shown, the blade 42 is rotated about an axis coinciding with point P, and therefore parallel to the surface 44.

Figure 4:
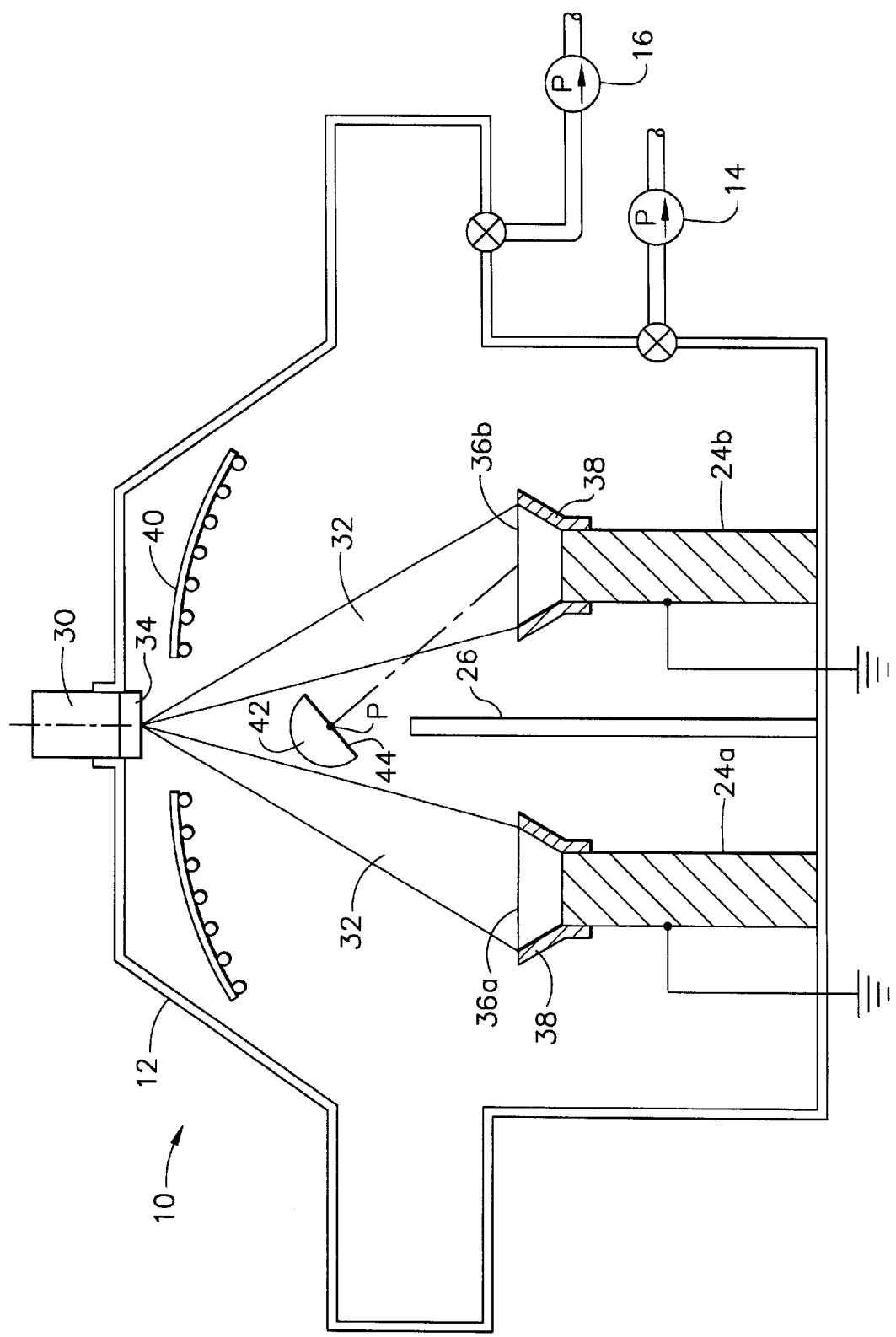

Finally, FIG. 4 illustrates the surface 44 as having a direct "line-of-sight" with the molten ceramic of the ingot 24*b*, while deposition of the molten ceramic from the other ingot 24*a* is again largely prevented by the orientation of the blade 42. As such, a full rotation of the blade 42 results in a multilayer coating composed of substantially homogeneous layers 60*a* and 60*b* of the ceramic materials from the ingots 24*a* and 24*b*, which are separated by an intermediate layer 60*c* composed of a mixture of the materials from the ingots 24*a* and 24*b*. According to the invention, the thicknesses of the individual layers 60*a*, 60*b* and 60*c* can be controlled by the rate at which the blade 42 is rotated or translated above the ingots 24*a* and 24*b*. Specifically, a faster rotational speed during a particular phase of the deposition process reduces the thickness of the layer being deposited during that phase. As such, using a variable or nonconstant rotational or translational speed, a ceramic layer 60*a* formed by the ceramic material of the ingot 24*a* can be deposited to have a thickness which is greater than the thickness of an adjacent layer 60*b* formed from the ceramic material from the ingot 24*b*. The relative thicknesses of the layers 60*a* and 60*b* can be further controlled by evaporating the ingots 24*a* and 24*b* at different rates or from differently sized crucibles. This technique may further involve the use of additional electron beam guns and/or additional crucibles and ingots.

According to this invention, the extent to which the molten ceramics are codeposited on the surface 44 of the blade 42 can be further regulated with a baffle 26 positioned between the ingots 24*a* and 24*b*, as shown in FIGS. 1 through 4. As shown, the baffle 26 serves to minimize the thickness of the intermediate layers 60c, while maximizing the homogeneity of the ceramic layers 60a and 60b, yielding a more pronounced transitional region between the layers 60a and 60b, as represented by the multilayer coating 60 of FIG. 5. The formation of an intermediate layer 60c between adjacent ceramic layers 60a and 60b, as illustrated by the embodiment of FIG. 5, is achieved by "rocking" the blade 42, i.e., oscillating the blade 42 by rotating it less than 360 degrees in a first direction, and then rotating the blade 42 less than 360 degrees in the opposite direction. Otherwise, the intermediate layer 60c is formed between alternating interfaces between the ceramic layers 60a and 60b.

An important aspect of this invention is that the apparatus 10 shown in FIGS. 1 through 4 has yielded the multilayer coating 60 characterized by discrete and homogeneous ceramic layers 60a and 60b and well-defined intermediate layers 60c, even though a molten portion of both ingots 24a and 24b are maintained throughout deposition, such that vapors of each ingot material coexist within the chamber 12. Therefore, key advantages of this invention include the ability to employ high deposition rates, elimination of the prior art requirement for transferring the blade 42 between coating apparatuses, and maintaining a molten pool of each ceramic material such that the surface of the blade 42 remains active and at a stable temperature. The latter benefits are particularly important for promoting adhesion of the ceramic layers 60a and 60b to the blade 42.

While our invention has been described in terms of a preferred embodiment, it is apparent that other forms could be adopted by one skilled in the art. Accordingly, the scope of our invention is to be limited only by the following claims.

What is claimed is:

1. A method for forming a multilayer thermal barrier coating, the method comprising the steps of:

supporting an article in proximity to separate deposition sources of different ceramic materials within a vessel that is at lest partially evacuated;

simultaneously heating and melting a portion of each of the ceramic materials so as to produce vapors of the ceramic materials that coexist within the vessel; and exposing and interrupting exposure of a surface of the article to the vapors such that the vapors sequentially deposit onto the surface and form homogeneous successive layers of the ceramic materials on the surface.

2. A method as recited in claim 1 wherein the interrupting step entails separating the ceramic materials with a baffle such that the vapor of only one of the ceramic materials is deposited on the surface at a given instant.

3. A method as recited in claim 1 wherein the interrupting step entails rotating the article within the vessel.

4. A method as recited in claim 3 wherein the article is rotated at a nonconstant speed such that the surface is subjected to deposition of a first of the ceramic materials for a duration longer than the surface is subjected to deposition of a second of the ceramic materials.

5. A method as recited in claim 3 wherein a first of the ceramic materials is melted at a higher rate than a second of the ceramic materials, so as to maintain within the vessel a greater amount of vapor of the first ceramic material as compared to the second ceramic material.

6. A method as recited in claim 1 wherein the interrupting step entails translating the article within the vessel.

7. A method as recited in claim 1 wherein the interrupting step entails oscillating the article by rotating the article less than 360 degrees in a first direction and then rotating the article in an opposite direction.

8. A method as recited in claim 1 wherein the interrupting step causes an intermediate layer to be formed between at least two adjacent layers of the homogeneous successive layers, the intermediate layer being a mixture of at least two of the ceramic materials.

9. A method as recited in claim 1 wherein the multilayer thermal barrier coating comprises a plurality of adjacent pairs of the homogeneous successive layers, and wherein the exposing and interrupting step causes an intermediate layer to be formed between each of the adjacent pairs of the homogeneous successive layers, the intermediate layer being a mixture of the ceramic materials that form the adjacent pairs of the homogeneous successive layers.

10. A method as recited in claim 1 wherein one of the successive layers formed from a first of the ceramic materials is deposited so as to have a thickness which is greater than a thickness of an adjacent successive layer formed from a second of the ceramic materials.

11. A method as recited in claim 1 wherein the ceramic materials are selected from the group consisting of yttria-stabilized zirconia and alumina.

12. A method for forming a multilayer thermal barrier coating on an airfoil, the method comprising the steps of:

rotating an airfoil within a vessel that is at least partially evacuated, the airfoil being positioned in proximity to a first ingot of a first ceramic material and a second and separate ingot of a second ceramic material;

separating the first and second ingots with a baffle;

simultaneously heating and melting a portion of each of the first and second ingots so as to produce vapors of the first and second ceramic materials that coexist within the vessel; and then exposing and interrupting exposure of a surface of the airfoil to the vapors, the baffle serving to intermittently interrupt exposure of the surface of the airfoil to one of the vapors as the airfoil is rotated such that the vapors sequentially deposit onto the surface and form homogeneous successive layers on the surface, at least one of the homogeneous successive layers having a columnar grain structure.

13. A method as recited in claim 12 wherein the rotating step entails rotating the airfoil at a nonconstant speed such that the surface is subjected to deposition of the first ceramic material for a duration longer than the surface is subjected to deposition of the second ceramic material.

14. A method as recited in claim 12 wherein the rotating step entails translating the airfoil within the vessel.

15. A method as recited in claim 12 wherein the rotating step entails oscillating the airfoil by rotating the airfoil less than 360 degrees in a first direction and then rotating the airfoil in an opposite direction.

16. A method as recited in claim 12 wherein the interrupting step causes an intermediate layer to be formed between at least two adjacent layers of the homogeneous successive layers, the intermediate layer being a mixture of the first and second ceramic materials.

17. A method as recited in claim 12 wherein the multilayer thermal barrier coating comprises a plurality of adjacent pairs of the homogeneous successive layers, and wherein the exposing and interrupting step causes an intermediate layer to be formed between each of the adjacent pairs of the homogeneous successive layers, the intermediate layer being a mixture of the first and second ceramic materials.

18. A method as recited in claim 12 wherein one of the successive layers formed from the first ceramic material is deposited so as to have a thickness which is greater than a thickness of an adjacent successive layer formed from the second ceramic material.

19. A method as recited in claim 12 wherein the ceramic materials are selected from the group consisting of yttria-stabilized zirconia and alumina.

20. A method as recited in claim 12 wherein the first ingot is melted at a higher rate than the second ingot, so as to maintain within the vessel a greater amount of vapor of the first ceramic material as compared to the second ceramic material.

* * * * *